(12) United States Patent
Ahmed et al.

(10) Patent No.: US 12,119,435 B2
(45) Date of Patent: Oct. 15, 2024

(54) SEMICONDUCTOR SMOOTHING APPARATUS AND METHOD

(71) Applicant: Intel Corporation, Santa Clara, CA (US)

(72) Inventors: Khaled Ahmed, San Jose, CA (US); Thomas L. Sounart, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 978 days.

(21) Appl. No.: 16/946,222

(22) Filed: Jun. 10, 2020

(65) Prior Publication Data

US 2021/0104650 A1   Apr. 8, 2021

(51) Int. Cl.
| | | |
|---|---|---|
| *H01L 33/62* | (2010.01) | |
| *B24B 7/22* | (2006.01) | |
| *C09K 13/04* | (2006.01) | |
| *C09K 13/06* | (2006.01) | |
| *C09K 13/08* | (2006.01) | |
| *H01L 25/075* | (2006.01) | |
| *H01L 27/12* | (2006.01) | |

(52) U.S. Cl.
CPC .............. *H01L 33/62* (2013.01); *B24B 7/228* (2013.01); *C09K 13/04* (2013.01); *C09K 13/06* (2013.01); *C09K 13/08* (2013.01); *H01L 25/0753* (2013.01); *H01L 27/1214* (2013.01); *H01L 2933/0066* (2013.01)

(58) Field of Classification Search
CPC ....... H01L 21/02019; H01L 21/30604–30621; H01L 21/30625; H01L 21/3063–30635; H01L 21/3065–30655; H01L 21/31051; H01L 21/31055–31056; H01L 21/31111–31122; H01L 21/31133–31138; H01L 21/3212–32125; H01L 21/32133–32139; H01L 21/465; H01L 21/7684; H01L 25/0753; H01L 27/1214; H01L 33/62

See application file for complete search history.

(56) References Cited

U.S. PATENT DOCUMENTS

| | | | | |
|---|---|---|---|---|
| 2003/0000645 | A1* | 1/2003 | Dornfest | ........... H01L 21/67167 257/E21.279 |
| 2010/0129982 | A1* | 5/2010 | Kao | ................... H01L 21/76232 257/E21.177 |
| 2018/0190583 | A1* | 7/2018 | DeLaCruz | .............. H01L 24/05 |
| 2020/0357972 | A1* | 11/2020 | Lutgen | ............... G02B 27/4272 |

* cited by examiner

*Primary Examiner* — Calvin Y Choi
(74) *Attorney, Agent, or Firm* — Alliance IP, LLC (57) ABSTRACT

An semiconductor manufacturing apparatus and method to smooth surfaces of discrete pads on a substrate. The method includes placing a surface of one of the discrete pads in registration with a first chamber of a set of chambers of a smoothing tool, the set corresponding to a smoothing cycle of the smoothing tool; etching, within the first chamber, a surface of one of the discrete pads to form an etch layer on the surface; placing the surface in registration with a second chamber of the set; after the etch, pumping gas and vapor from the surface within the second chamber; placing the surface in registration with a third chamber of the set; and applying heating to the surface in the third chamber to smooth the surface.

10 Claims, 7 Drawing Sheets

SEMICONDUCTOR SMOOTHING APPARATUS AND METHOD

TECHNICAL FIELD

Embodiments relate to micro-light-emitting-diode (LED) displays and, in particular, to tools and methods to smooth copper planes to be used in micro-LED elements.

BACKGROUND

Displays having micro-scale light-emitting diodes (LEDs) are known as micro-LED, mLED, and μLED. As the name implies, micro-LED displays have arrays of micro-LEDs forming the individual pixel elements of a display. Micro-LED displays promise a 3× to 5× reduced power consumption as compared to organic LED (OLED) displays. OLED displays are made of small LEDs made of organic materials. Micro-LEDs promise a two-fold emitter" power reduction as compared to OLEDs, and provide improved user experience.

However, the assembly of micro-LEDs includes the transfer and bonding of micro-LED elements from source semiconductor wafers to a display backplane of a display. Processes are needed to address the need to provide smoother copper surfaces for the micro-LED elements to allow a bonding of the same to the display backplane.

DETAILED DESCRIPTION

Embodiments pertain to micro-light-emitting diode (LED) displays and to the fabrication of the same, and to a device and method for smoothing copper layers of micro-LED elements before their transfer onto a display backplane.

In the following description, specific details are set forth, but embodiments of the technologies described herein may be practiced without these specific details. Well-known circuits, structures, and techniques have not been shown in detail to avoid obscuring an understanding of this description. "An embodiment," "various embodiments," "some embodiments," and the like may include features, structures, or characteristics, but not every embodiment necessarily includes the particular features, structures, or characteristics.

Some embodiments may have some, all, or none of the features described for other embodiments. "First," "second," "third," and the like describe a common object and indicate different instances of like objects being referred to. Such adjectives do not imply objects so described must be in a given sequence, either temporally or spatially, in ranking, or in any other manner "Connected" may indicate elements are in direct physical or electrical contact with each other and "coupled" may indicate elements co-operate or interact with each other, but they may or may not be in direct physical or electrical contact. Terms modified by the word "substantially" include arrangements, orientations, spacings or positions that vary slightly from the meaning of the unmodified term. For example, a microphone located substantially at the center of a display includes microphones located within a few pixels of the center of the display.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

The description may use the phrases "in an embodiment," "in embodiments," "in some embodiments," and "in various embodiments," each of which may refer to one or more of the same or different embodiments. Furthermore, the terms "comprising," "including," "having," and the like, as used with respect to embodiments of the present disclosure, are synonymous.

Displays based on inorganic micro-LEDs have attracted increasing attention for applications in emerging portable electronics and wearable computers such as head-mounted displays and wristwatches. Micro-LEDs are first manufactured on wafers made, for example, of sapphire or silicon and then transferred onto a display backplane glass substrate on which active matrix thin-film transistors have been manufactured. Micro-LEDs with inorganic LEDs have better reliability then OLEDs.

Similar to OLED, micro-LED technology is an emissive display technology. However, due to the inorganic nature of the emitting materials, their efficiency and narrow emission bands, micro-LEDs also offer the prospect of significantly improved performance in terms of energy consumption, color gamut, brightness, contrast (High Dynamic Range), long lifetime and environmental stability (e.g., no or low sensitivity to air and moisture), and/or compatibility with flexible backplane technologies to enable curved or flexible displays.

Micro-LED arrays produce their own light in response to current flowing through the individual elements of the array. A variety of different LED-like luminescent sources have been used for such displays. The embodiments described herein utilize electroluminescent materials in micro-LEDs made, for example, of GaN, InGaN, AlInGaP materials. Electrically, these devices look like diodes with forward "on" voltage drops ranging from 1.9 volts (V) to 3 V depending on the color. Unlike liquid crystal displays (LCDs), micro-LEDs are current driven devices. However, they may be similarly arranged in a two-dimensional array (matrix) of elements to form a display. Active-matrix micro- LED displays use current control circuits integrated with the display itself, with one control circuit corresponding to each individual element on the substrate to create high-resolution color graphics with a high refresh rate. This structure results in a matrix of devices, one (or more) device formed at each point where a row overlies a column. There will generally be at least MxN devices in a matrix having M rows and N columns Typical micro-LED devices conduct current and luminesce when voltage of one polarity is imposed across them, and block current when voltage of the opposite polarity is applied. To control these individual micro-LED devices located at the matrix junctions, it is useful to have two distinct driver circuits, one to drive the columns and one to drive the rows. It is conventional to sequentially scan the rows (conventionally connected to device cathodes) with a driver switch to a known voltage such as ground, and to provide another driver to drive the columns (which are conventionally connected to device anodes). In operation, information is transferred to the matrix display by scanning each row in sequence. During each row scan period, each column connected to an element intended to emit light is also driven.

Reference is now made to the drawings (which are not to scale), wherein similar or same numbers may be used to designate the same or similar parts in different figures. The use of similar or same numbers in different figures does not mean all figures including similar or same numbers constitute a single or same embodiment. In the following description, for purposes of explanation, numerous specific details are set forth in order to provide a thorough understanding thereof. It may be evident, however, that the novel embodiments can be practiced without these specific details. In other instances, well known structures and devices are shown in block diagram form in order to facilitate a description thereof. The intention is to cover all modifications, equivalents, and alternatives within the scope of the claims.

Figure 1:
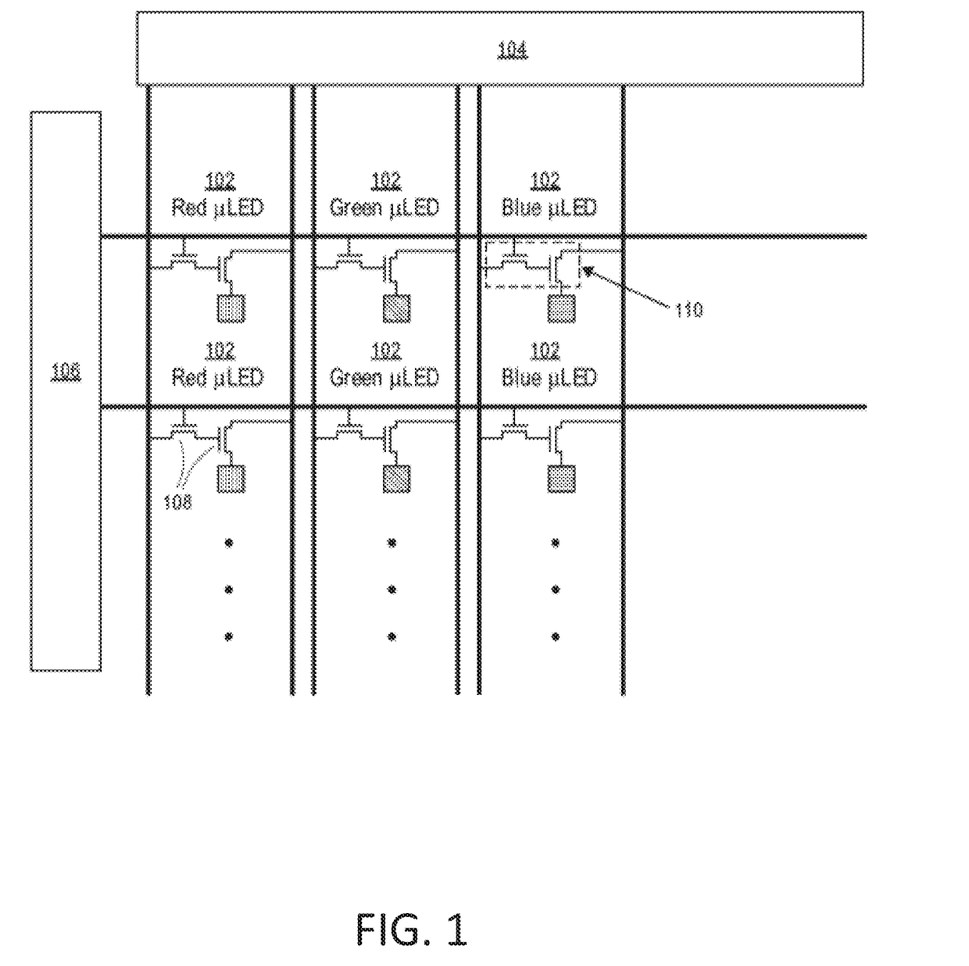
FIG. 1 is a schematic illustration of a micro-LED display architecture, in accordance with an embodiment of the present disclosure.

FIG. 1 is a schematic illustration of a micro-LED display architecture, in accordance with an embodiment of the present disclosure. Referring to FIG. 1, micro-LED elements 102 are arranged in a matrix. The micro-LED elements are driven through "Data Driver" 104 and "Scan Driver" 106 chips. Thin film transistors 108 are used to make "pixel driver circuits" 110 for each micro-LED element. In an embodiment, micro-LED elements are fabricated on, for example, a silicon or sapphire wafer then transferred to a glass substrate called "backplane" where the "pixel driver circuits" 110 have been fabricated using thin film transistors.

Prior art methods of transferring and bonding micro-LED elements from a source wafer to the "backplane" substrate of a display involve fusion bonding (FB) or thermo-compression bonding (TCB) of the contact pads of the micro-LED elements on the wafer with corresponding contact pads of the display backplane. The contact pads are typically made of any suitable conducting material, such as, for example, a metal (for example, copper, nickel, gold, tungsten, titanium, tantalum, ruthenium, zirconium, cobalt, aluminum, lead, platinum, tin, silver), conducting metallic compound material (for example, copper nitride, tantalum nitride, titanium nitride, tantalum carbide, titanium carbide, titanium aluminum carbide, tungsten silicide, tungsten nitride, ruthenium oxide, cobalt silicide, nickel silicide), carbon nanotubes, conductive carbon, graphene, or any suitable combination of these materials.

Such bonding methods require a high degree of smoothness of the free surfaces of the contact pads. For example, copper contact pad surfaces need to have surface roughness less than about 0.5 nm in order for either FB or TCB to the backplane contact pads to be feasible. However, such a high degree of smoothness is difficult to achieve on the display side of the assembly, mainly as a result of a lack of commercial copper chemical-mechanical planarization (CMP) tools or electropolishing tools that work on large rectangular substrates include discrete contact pads thereon. For example, currently available CMP tools may be used on substrate sizes of 300 mm or less. However, especially in the context of display manufacturing, substrate sizes can include a 1 m by 1.5 m substrate. In addition, commercial electropolishing apparatuses are not available today at Gen 4.5 sizes and above, and current electropolishing tools are not adapted to polish discrete pads, such as discrete contact pads.

Some embodiments include a semiconductor manufacturing apparatus and a semiconductor manufacturing method of smoothing the surface of discrete pads on a substrate, such as discrete electroconductive contact pads on a display backplane for a micro-LED display. The smoothing apparatus may define a set of discrete open chambers therein. The apparatus may be positioned with respect to a substrate, such as a glass substrate of a display backplane, such that its discrete open chambers are placed in registration with corresponding discrete pads of the substrate. In order to place the respective discrete chambers in registration with corresponding ones of the discrete pads on the substrate, the apparatus may be adapted for reciprocal motion with respect the surface of the substrate carrying the discrete pads thereon, such as linear motion, or circular motion, or other reciprocal motion that allows registration as described above. The reciprocal motion is to allow an accommodation of large size substrates such as large size display backplanes for smoothing of discrete pads thereon (e.g. generation (Gen) 4.5 or Gen 6 glass substrates used for display manufacturing).

Embodiments allow the atomic etching of respective surfaces of discrete pads on a substrate, and a vaporization and removal of the etchant to smooth the respective surfaces using an apparatus having a body defining a plurality of discrete open chambers, where each chamber is adapted to expose a surface with which it is in registration to a discrete process. According to some embodiments, the chambers may define tubes. In one example, there is provided one chamber per discrete pad, and in another example, there is provided one chamber per a plurality of discrete pads where the plurality can be exposed to the environment of the chamber simultaneously . Embodiment advantageously make possible the implementation of different processes per chamber on different discrete pads of the same substrate. According to some embodiments, one or more chambers, such as chambers serving as reactive gas outlets, may be pressure controlled.

According to embodiments, a first chamber of the discrete open chambers may be adapted to receive a reactive gas therein. The reactive gas may include a reactive plasma or ionic gas. The reactive gas may sometimes be referred to herein as an "etchant gas." A second chamber of the discrete open chambers may be adapted to have gas, vapor and/or suspended particles contents pumped therefrom. A third chamber of the discrete open chambers may include a heat source, such as, for example, a radiative heat source (e.g. laser) configured to supply radiant heat therein. A fourth chamber of the discrete open chambers may be adapted to receive a purge gas therein. A fifth chamber of the discrete open chambers may be adapted to have its purge gas contents pumped therefrom.

According to a first embodiment, the third open chamber, that is, the chamber adapted to supply radiative heat, may correspond to the second chamber, and may therefore further be adapted to have its gas, vapor and/or particle contents pumped therefrom. According to a second embodiment, the first, second, third and fourth chambers are distinct from one another, the reactive gas is a first reactive gas, and the third open chamber, that is, the chamber adapted to supply radiative heat, is also adapted to receive a second reactive gas therein. According to some other embodiments, any one of the first, second, third or fourth chambers may correspond with one another. More detail is provided below regarding the first and second embodiments.

According to embodiments, during the smoothing process, the apparatus may be configured to introduce a reactive plasma or ionic gas into the first chamber thereof such that the reactive plasma or ionic gas is in contact with a surface of the discrete pad that is in registration with the first chamber. The reactive plasma or ionic gas may react with the surface of the discrete pad at a first temperature, such as at room temperature, to form a volatile compound.

According to the first embodiment, as noted previously, the apparatus may be configured such that the third chamber, configured to supply radiant heat to the surface of the discrete pad that is in registration therewith, corresponds to the second chamber, and is therefore further adapted to have its gas, vapor and/or particle contents pumped therefrom. The apparatus may therefore, according to this first embodiment, subsequent to exposure of the surface of the discrete pad to the reactive plasma or ionic gas in the first chamber, supply heat to this surface and pump away gases, vapors, and/or any suspended particles by way of the second/third chamber. According to this first embodiment, the radiative heat source may vaporize an "etch layer"/layer of a volatile compound/reactive layer formed on the surface of the discrete pad that is exposed to the gas within the first chamber. The heating may be applied so that the volatile compounds on the surface may be vaporized and pumped away from the surface of the discrete pad along with any remaining amount of the reactive plasma or ionic gas. According to this embodiment, the heating may alternatively be implemented by the apparatus by way of heating the entire substrate carrying the discrete pads thereon, for example from a surface thereof opposite the surface carrying the discrete pads, although this alternative is not shown.

According to the second embodiment, the apparatus may be configured such that the second chamber is coupled to a pump such that, when it is placed in registration with the surface of the discrete pad after its exposure to the reactive plasma or ionic gas in the first chamber, gases resulting from the volatile compounds, along with any remaining reactive plasma or ionic gas and any potential particles, may be pumped therefrom without heating.

According to some embodiments, including the first and second embodiments, the apparatus may include the fourth chamber as noted above, which may be adapted to expose the surface of the discrete pad with which it is in registration to a purge gas, such as an inert gas, that may be used to purge this surface from any residual volatile compounds left over from pumping that was implemented after application of the reactive plasma or ionic gas. Thereafter, any residual volatile compounds, gases, or particles, including any residual purge gases, may be pumped from the surface by way of the fifth chamber.

According to some embodiments, including the first and second embodiments, the fourth and fifth chambers of the apparatus may be placed after the second chamber, such that, after a pumping by way of the second chamber, a purge and pump process may be implemented on the surface of the discrete pad via the fourth and fifth chambers respectively.

According to the first embodiment, a smoothing cycle of the apparatus may therefore involve exposure of a discrete pad on a substrate to the first chamber (involving the application of the reactive plasma or ionic gas), followed by the second/third chamber (involving the application of heat and the pumping of gases, vapors and/or particles), followed by the fourth and fifth chambers (involving the exposure of the discrete pad to the purge gas and the pumping of residual gases, vapors and particles from the discrete surface after application of the purge gas).

According to the second embodiment, the reactive ionic gas of the first chamber is a first reactive ionic gas, and the third chamber, that is, the chamber adapted to provide radiant heat, is further adapted to expose the discrete pad with which it is in registration to a second reactive ionic gas different from the first reactive ionic gas. According to this second embodiment, the apparatus further includes a sixth chamber of the discrete open chambers that is adapted to pump gases, vapors and/or particles (similar to the second chamber), a seventh chamber of the discrete open chambers that is adapted to provide a purge gas (similar to the fourth chamber), and an eighth chamber of the discrete open chambers that is adapted to pump gases, vapors and/or particles (similar to the fifth chamber).

According to the second embodiment, a smoothing cycle of the apparatus may therefore involve exposure of a discrete pad on a substrate to the first chamber (involving the application of a first reactive plasma or ionic gas), followed by the second chamber (involving the pumping of gases, vapors and/or particles), followed by the fourth and fifth chambers (involving the exposure of the discrete pad to the purge gas and the pumping of residual gases, vapors and particles from the discrete surface after application of the purge gas), followed by the third chamber (involving the application of heat and of a second reactive plasma or ionic gas), followed by the sixth, seventh chambers and eighth chambers (involving the pumping of gases, vapors and/or particles, exposure of the discrete pad to the purge gas for a second time and the pumping of residual gases, vapors and particles from the discrete surface after application of the purge gas).

According to some embodiments, the apparatus may be configured to include multiple sets of discrete open chambers with each set corresponding to a smoothing cycle. A given discrete pad may be exposed to multiple smoothing cycles through multiple sets of chambers in order to achieve a desired level of smoothness. A plurality of discrete pads may under various stages of the smoothing process by simultaneously undergoing any of the processes of corresponding ones of the chambers. A desired level of smoothness may be determined prior to starting the process by way of testing, for example by preliminarily implementing a smoothing method according to some embodiments and using a profilometer of resulting discrete pads to measure whether a desired smoothness has been reached.

According to some embodiments, for polishing copper surfaces, for example where the reactive plasma or ionic gas includes fluorine (F), the first temperature (the temperature at which the reactive plasma or ionic gas according to the first embodiment, or the first reactive plasma or ionic gas according to the second embodiment) may be in the range of between about 20° C. and about 50° C., and the second temperature (the temperature at which gases, vapors and/or particles are pumped out according to the first embodiment, or the temperature at which the second reactive plasma or ionic gas is applied according to the second embodiment) may be in the range between about 100° C. and about 200° C. According to some embodiments, the first temperature may be below the isotropic etch point of the surface of the discrete pad being smoothed (sometimes referred to herein as "the etch layer"), such as copper, and the second temperature may be greater than or equal to the isotropic etch point of the etch layer.

The heat source may, for example, be a radiative heat source (e.g. laser) located in any or all of the pump or purge channels following the reactive gas. Positioning the thermal elements in the pump (or vacuum) chambers/channels may be desirable as the by-product created by vaporizing the etch layer/etch film on the surface being smoothed can be immediately removed from the chamber. This minimizes the potential for condensation of the by-product onto the substrate surface or a surface of the processing chamber.

According to one embodiment, a copper surface on a glass substrate moving laterally beneath an apparatus including a gas distribution plate defining multiple sets of discrete open chambers as described above, and comprising a plurality of elongate gas ports to supply reactive ionic gas to some of the chambers may be provided. According to the second embodiment, a first gas outlet to deliver a first reactive gas and second gas outlet to deliver a second reactive gas different from the first reactive gas may be provided. An etch layer may be formed on the surface a discrete pad of the substrate each time a reactive ionic gas is applied thereto. According to the second embodiment, the surface of the discrete pad may be sequentially exposed to the first reactive gas in the first chamber and to the second reactive gas in the third chamber as described above to smooth the surface for subsequent surface to surface bonding.

Figure 2:
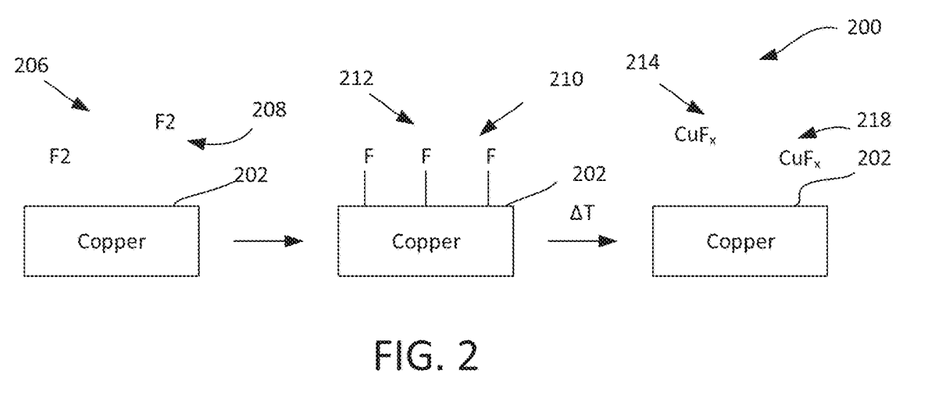
FIG. 2 is a schematic depiction of a copper contact pad of a display backplane as being subjected to a method according to one embodiment.

Reference is now made to FIG. 2, which schematically depicts a copper pad 202 as being subjected to a method 200 according to one embodiment. As seen in FIG. 2, the copper pad 202 may be subjected at operation 206 to a reactive plasma or ionic gas 208 such as ionic fluorine ($F_2$) at a first temperature.

According to some embodiments, the reactive gas may be selected based on the material of the surface to be smoothed. In general, a reactive plasma or ionized gas may include oxygen ions, chlorine ions, fluorine ions, bromine ions, or iodine ions. In general, gases with electronegativity of about 2.8 or above may be chosen to provide the plasma or ionized gas to be used as the reactive gas, although the selection of other gases is also possible as the reactive gas according to embodiments. For example, fluorocarbons may be used to yield the reactive gas. The reactive gas could include ions created using ICP (inductively coupled plasma) or another type of plasma.

Some embodiments may result in a micro-LED display panel where the contact pads include traces of gases with electronegativity of about 2.8 or above.

Referring still to FIG. 2, as a result of the reaction between the fluorine and the surface of the copper as shown at 212, a first etch layer or reactive layer 210 forms on the copper surface, such as a layer of CuF or $CuF_2$. The reaction mechanism in method 200 takes advantage of the roughness of the surface of the copper pad 202 at the outset. Protrusions or "hills" representative of the roughness of the copper pad surface will have a much higher tendency to react with the reactive plasma or ionic gas than valleys representative of that roughness. This is because the reactive plasma or ionic gas, $F_2$ by virtue of being charged, is directional, and as a result reacts differently, and presents a higher etch rate, with the tops of the surface roughness protrusions of the copper pad surface as compared with the sides of the protrusions. This difference in etch rates ultimately results in an atomic level smoothing of the surface of the copper pad 202.

Referring still to FIG. 2, excess first reactive gas may be removed from the area of the surface of the copper pad to avoid gas phase reactions in subsequent operations, such as by way of pumping (not shown). The local temperature of the substrate surface may then be changed from the first temperature to a second temperature at operation 214 to vaporize the first reactive layer 210 or etch layer (CuF or CuF2) and to form a vapor CuFx 218 therefrom. The vaporized etch layer 218 may then be pumped from the processing chamber.

Where copper contact pads of micro-LED elements on a source substrate are involved, or where copper contact pads on a display backplane are involved, a reactive plasma or ionic gas may, according to an embodiment, react with the surface of the copper contact pad to form volatile compounds such as a reactive layer (similar to reactive layer 210) thereon. The surface of the copper contact pad surface may then be locally heated in the area where the volatile compounds has been formed so that the volatile compounds can be purged from the surface of the copper contact pad. Thus, a layer of the copper contact pad is thus etched out and the copper contact pad therefore can present an atomically smooth surface for subsequent bonding between micro-LED elements on the source substrate and a display backplane.

When certain surfaces, such as a copper surface is brought in contact with another copper surface at room temperature, and the surfaces are smooth at the noted levels, the contact would lead to bonding of the copper surface to one another. This mechanism, as previously noted, is instrumental in allowing the transfer of micro-LED elements on source wafers onto a display backplane using contact pad to contact pad bonding as noted above, such as copper to copper bonding.

According to one embodiment, an apparatus and method may be configured to lead to smoothing of a surface, such as of a copper surface, from a root mean square (RMS) roughness of about 3 nm to about 5 nm to a RMS roughness of about 0.5 nm or less. By way of example, a use case for electroconductive pads on a substrate smoothed using an apparatus and method according to some embodiments may involve smoothing, on the one hand, contact pads on micro-LED elements on a source substrate and, on the other hand, contact pads on a display backplane to enable contact pad to contact pad bonding of the micro-LED element contact pads to corresponding contact pads of the display backplane, for example at room temperature.

Advantages of embodiments include a high yielding/high throughput surface polishing process for the smoothing of discrete pads on a substrate, including, by way of example, the smoothing of discrete pads on a large substrate. Advantages of some embodiments include the provision of strong bonding of micro LEDs to display backplanes.

One use case for an apparatus according to some embodiments is to provide smooth enough contact pads to allow a bonding of micro-LEDs to a display backplane as noted above. However, some embodiments of the apparatus and method may be applied in other use cases and applications, such as the smoothing of any starting surface in general that is apt to react with a reactive gas to form etch compounds that can be pumped away from the surface after the reaction with the gas to result in a surface that is smoother than the starting surface.

Figure 3:
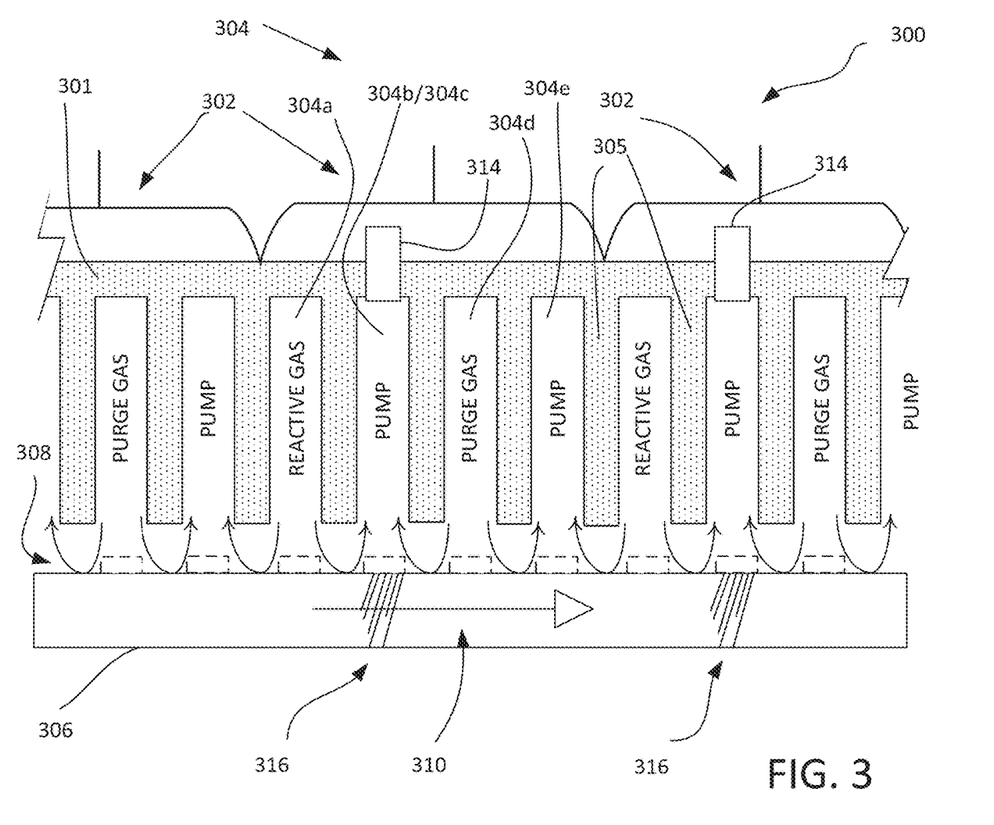
FIG. 3 is a partial cross-sectional side view of one example of a smoothing apparatus to be used in semiconductor manufacturing according to a first embodiment.

Reference is now made to FIG. 3, which shows a partial cross-sectional side view of one example of a smoothing apparatus 300 to be used in semiconductor manufacturing according to the first embodiment as described above. Apparatus 300 may be used to implement a method according to one version of the first embodiment to smooth the surface of discrete pads on a substrate, such as discrete electroconductive contact pads on a display backplane. The smoothing apparatus 300 defines multiple sets 302 of discrete open chambers 304 or sections therein. Although one complete set 302 is shown, the apparatus 300 in the embodiment of FIG. 3 includes multiple repetitions of the set 302 as suggested in the figure, although embodiments are not so limited. The apparatus 300 is adapted to be positioned with respect to a substrate 306, such as a glass substrate of a display backplane, such that its discrete open chambers 302 are placed in registration with corresponding discrete pads 308 of the substrate 306. Each discrete pad 308 may move in the direction of arrow 310 through at least the smoothing cycle offered by one set 302 of discrete open chambers. The chambers 304 are discrete in that they define cavities that are separated from one another by way of walls 305. The respective chambers 304 are open in that they define openings at ends thereof adapted to face respective, corresponding ones of the discrete pads with which they are in registration during a smoothing operation. The openings allow the corresponding ones of the discrete pads 308 to be exposed to an environment of the respective chambers with which they are in registration, and the exposure may still be such that, even while in registration, one or more chambers are pressure controlled. The discrete pads may correspond to electroconductive pads such as copper pads, and the substrate 306 may correspond to a glass substrate of a display backplane. In order to place the respective discrete chambers 302 in registration with corresponding ones of the discrete pads 308 on the substrate 306, the apparatus may be adapted for reciprocal motion with respect the surface of the substrate carrying the discrete pads 308 thereon, such as linear motion, or circular motion, or other reciprocal motion that allows registration as described above. In the shown embodiment of FIG. 3, the substrate may move linearly with respect to the apparatus 300 as shown by way of arrow 310 which denotes motion. Embodiments however envisage the tool moving in relation to the substrate in the opposite direction, or both the substrate and the tool moving with respect to one another, or the tool and the substrate moving non-linearly with respect to one another.

Motion arrow 310 is to further denote that, in operation, a given discrete pad 308 may move through a set 302 of chambers 304 to go through a smoothing cycle as will be described below. According to one embodiment, a discrete pad 308 may be taken through one or more smoothing cycles of the apparatus 300 in order to achieve a target level of smoothness. It is clear from FIG. 3 that apparatus 300 further makes possible exposing a plurality of discrete pads 308 to various stages of the smoothing cycle simultaneously.

Referring still to FIG. 3, a first chamber 304a of the discrete open chambers 304 may be adapted to receive a reactive gas therein, for example by way of a gas inlet opening or gas port leading thereto (not shown). A second chamber 304b of the discrete open chambers 304 may be adapted to have gas, vapor and/or suspended particles contents pumped therefrom, for example by being connected to a pumping mechanism that may pump the contents of the second chamber 304b away for the chamber by way of an outlet (now shown). A third chamber 304c of the discrete open chambers may include a heat source or heating element 314, such as, for example, a radiative heat source (e.g. laser) configured to supply radiant heat therein. In this first embodiment of an apparatus, as noted previously, the second chamber 304b and the third chamber 304c may correspond to one another. A fourth chamber 304d of the discrete open chambers 304 may be adapted to receive a purge gas therein, for example by way of a gas inlet opening or gas port leading thereto (not shown). A fifth chamber 304e of the discrete open chambers may be adapted to have its purge gas contents pumped therefrom, for example by being connected to a pumping mechanism that may pump the contents of the second chamber 304b away for the chamber by way of an outlet (now shown).

Referring still to FIG. 3, in operation, during a smoothing cycle of the smoothing process, the apparatus 300 may be configured as a gas plate 301 to introduce a reactive plasma or ionic gas into the first chamber 304a thereof such that the reactive plasma or ionic gas is in contact with a surface of the discrete pad 308 that is in registration with the first chamber 304a. The reactive plasma or ionic gas may react with the surface of the discrete pad 308 at a first temperature, such as at room temperature, to form a volatile compound or etch layer thereon. This stage of the smoothing process may for example correspond to stages 206 and 212 of the process depicted schematically in FIG. 2.

Apparatus 300 may further be configured such that, subsequent to exposure of the surface of the discrete pad 308 to the reactive plasma or ionic gas in the first chamber 304a, and after this same discrete pad has been placed in registration with the second/third chamber 304b/304c, the apparatus heats the surface of the discrete pad using the heating element 314 and pumps away gases, vapors and/or any suspended particles by way of the second/third chamber 304b/304c. According to this first embodiment, the radiative heat source or heating element 314 may vaporize an "etch layer" formed on the surface of the discrete pad 308 that was exposed to the gas within the first chamber 304a, and it may do so through local heating as shown by local heated regions 316 of substrate 306. The heating may be applied so that the volatile compounds on the surface may be vaporized and pumped away from the surface of the discrete pad along with any remaining amount of the reactive plasma or ionic gas. According to this first embodiment, the heating may alternatively or at the same time be implemented by the apparatus by way of heating the entire substrate 306 carrying the discrete pads thereon, or a portion of the substrate 306 corresponding to the discrete pad surface to the heated, for example from a side of the substrate 306 opposite the surface carrying the discrete pads 308, although this alternative is not shown.

Apparatus 300 may further be configured such that, subsequent to the heating and pumping having been implemented on the given discrete pad 308, and after the discrete pad 308 has been placed in registration with the fourth chamber 304d, the apparatus exposes the surface of the discrete pad 308 to a purge gas, such as an inert gas, that may be used to purge this surface from any residual volatile compounds left over from pumping within the second/third chamber 304b/304c. Apparatus 300 may further be configured such that, subsequent to the application of the purge gas, and after the discrete pad 308 has been placed in registration with the fifth chamber 304e, the apparatus may effect a pumping of any residual volatile compounds, gases or particles, including any residual purge gases, from the surface.

According to the first embodiment, as depicted by way of example in the apparatus 300 of FIG. 3, a smoothing cycle of the apparatus may therefore involve exposure of a discrete pad on a substrate to the first chamber 304a (involving the application of the reactive plasma or ionic gas), followed by the second/third chamber 304b/304c (involving the application of heat and the pumping of gases, vapors and/or particles), followed by the fourth and fifth chambers 304d and 304e (involving the exposure of the discrete pad to the purge gas and the pumping of residual gases, vapors and particles from the discrete surface after application of the purge gas).

Figure 4:
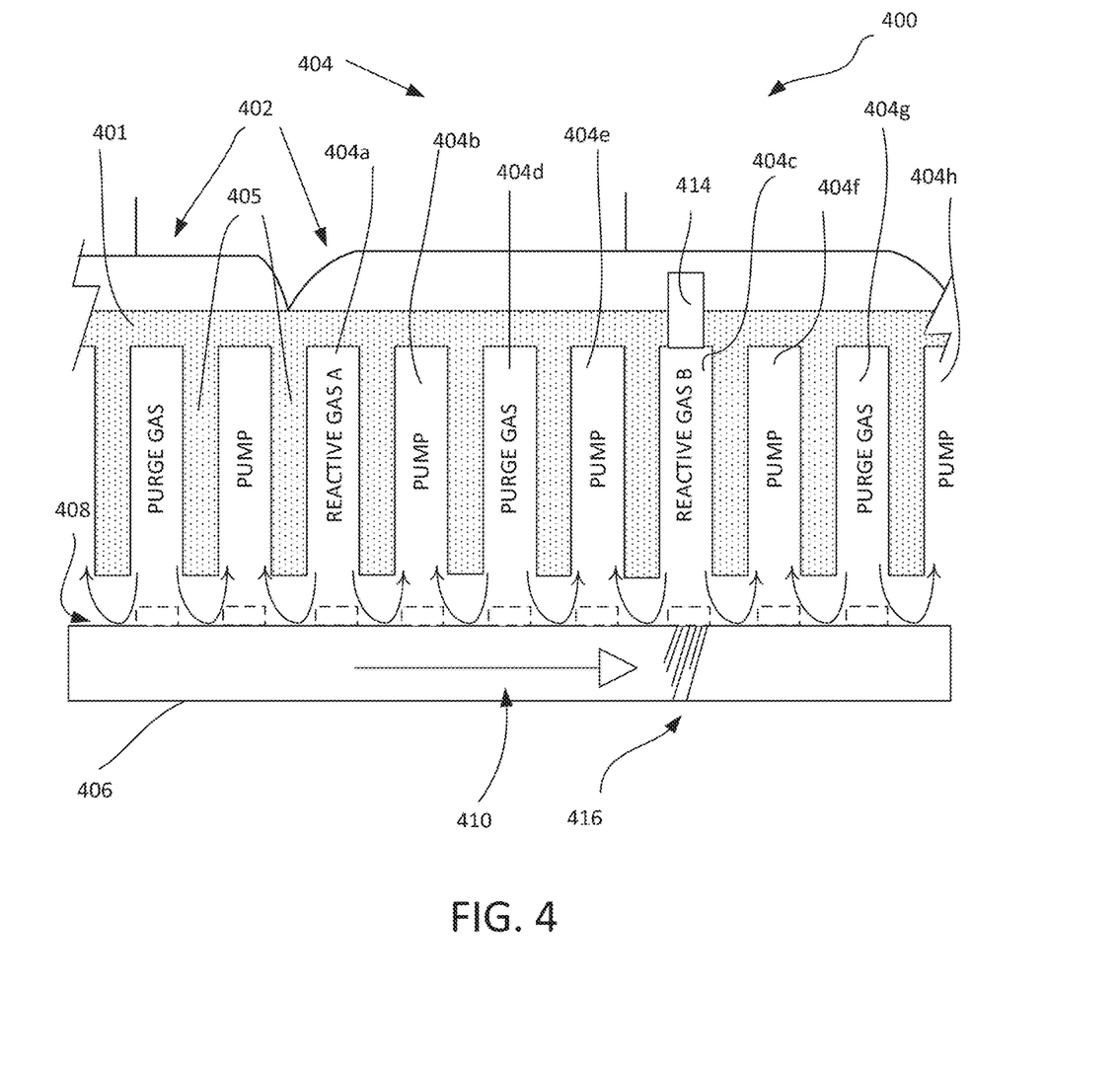
FIG. 4 is a partial cross-sectional side view of one example of a smoothing apparatus to be used in semiconductor manufacturing according to a second embodiment.

Reference is now made to FIG. 4, which shows a partial cross-sectional side view of one example of a smoothing apparatus 400 to be used in semiconductor manufacturing according to the second embodiment as described above. In FIG. 4, features similar to those in FIG. 3 have been designated with the same reference numerals. Apparatus 400 may be used to implement a method according to one version of the second embodiment to smooth the surface of discrete pads on a substrate, such as discrete electroconductive contact pads on a display backplane. The smoothing apparatus 400 defines multiple sets 402 of discrete open chambers 404 or sections therein. Although one complete set 402 is shown, the apparatus 400 in the embodiment of FIG. 4 includes multiple repetitions of the set 402 as suggested in the figure, although embodiments are not so limited. The apparatus 400 is adapted to be positioned with respect to a substrate 406, such as a glass substrate of a display backplane, such that its discrete open chambers 402 are placed in registration with corresponding discrete pads 408 of the substrate 406. Each discrete pad 408 may move in the direction of arrow 410 through at least the smoothing cycle offered by one set 402 of discrete open chambers. The chambers 404 are discrete in that they define cavities that are separated from one another by way of walls 405. The respective chambers 404 are open in that they define openings at ends thereof adapted to face respective, corresponding ones of the discrete pads with which they are in registration during a smoothing operation. The openings allow the corresponding ones of the discrete pads 408 to be exposed to an environment of the respective chambers with which they are in registration, and the exposure may still be such that, even while in registration, one or more chambers are pressure controlled. The discrete pads may correspond to electroconductive pads such as copper pads, and the substrate 406 may correspond to a glass substrate of a display backplane. In order to place the respective discrete chambers 402 in registration with corresponding ones of the discrete pads 408 on the substrate 406, the apparatus may be adapted for reciprocal motion with respect the surface of the substrate carrying the discrete pads 408 thereon, such as linear motion, or circular motion, or other reciprocal motion that allows registration as described above. In the shown embodiment of FIG. 4, the substrate may move linearly with respect to the apparatus 400 as shown by way of arrow 410 which denotes motion. Embodiments however envisage the tool moving in relation to the substrate in the opposite direction, or both the substrate and the tool moving with respect to one another, or the tool and the substrate moving non-linearly with respect to one another.

Motion arrow 410 is to further denote that, in operation, a given discrete pad 408 may move through a set 402 of chambers 404 to go through a smoothing cycle as will be described below. According to one embodiment, a discrete pad 408 may be taken through one or more smoothing cycles of the apparatus 400 in order to achieve a target level of smoothness. It is clear from FIG. 4 that apparatus 400 further makes possible exposing a plurality of discrete pads 408 to various stages of the smoothing cycle simultaneously.

Referring still to FIG. 4, a first chamber 404a of the discrete open chambers 404 may be adapted to receive a first reactive gas therein, for example by way of a gas inlet opening or gas port leading thereto (not shown). A second chamber 404b of the discrete open chambers 404 may be adapted to have gas, vapor and/or suspended particles contents pumped therefrom, for example by being connected to a pumping mechanism that may pump the contents of the second chamber 404b away for the chamber by way of an outlet (now shown). A third chamber 404c of the discrete open chambers may include a heat source or heating element 414, such as, for example, a radiative heat source (e.g. laser) configured to supply radiant heat therein, and may be adapted to receive a second reactive gas therein different from the first reactive gas, for example by way of a gas inlet opening or gas port leading thereto (not shown). A fourth chamber 404d of the discrete open chambers 404 may be adapted to receive a purge gas therein, for example by way of a gas inlet opening or gas port leading thereto (not shown). A fifth chamber 404e of the discrete open chambers may be adapted to have its purge gas contents pumped therefrom, for example by being connected to a pumping mechanism that may pump the contents of the second chamber 404b away for the chamber by way of an outlet (now shown). A sixth chamber 404f of the discrete open chambers 404 may be adapted to have gas, vapor and/or suspended particles contents pumped therefrom, for example by being connected to a pumping mechanism that may pump the contents of the sixth chamber 404f away for the chamber by way of an outlet (now shown). A seventh chamber 404g of the discrete open chambers 440 may be adapted to receive a purge gas therein, for example by way of a gas inlet opening or gas port leading thereto (not shown). An eighth chamber 404h of the discrete open chambers may be adapted to have its purge gas contents pumped therefrom, for example by being connected to a pumping mechanism that may pump the contents of the eighth chamber 404h away for the chamber by way of an outlet (now shown).

In this second embodiment of an apparatus, the first through eighth chambers may be distinct from one another as suggested in the version of this embodiment shown in FIG. 4.

According to an example of the second embodiment, a copper surface of a copper pad on a glass substrate may move laterally beneath a gas distribution plate comprising a plurality of elongate gas ports including a first gas outlet to deliver a first reactive gas and second gas outlet to deliver a second reactive gas different from the first reactive gas.

Referring still to FIG. 4, in operation, during a smoothing cycle of the smoothing process, the apparatus 400 may be configured as a gas plate 401 to introduce a first reactive plasma or ionic gas into the first chamber 404 a thereof such that the first reactive plasma or ionic gas is in contact with a surface of the discrete pad 408 that is in registration with the first chamber 404a. The first reactive plasma or ionic gas may react with the surface of the discrete pad 408 at a first temperature, such as at room temperature, to form a volatile compound or etch layer thereon. This stage of the smoothing process may for example correspond to stages 206 and 212 of the process depicted schematically in FIG. 2.

Apparatus 400 may further be configured such that, subsequent to exposure of the surface of the discrete pad 408 to the first reactive plasma or ionic gas in the first chamber 404a, and after this same discrete pad has been placed in registration with the second chamber 404b, the apparatus pumps away gases, vapors and/or any suspended particles by way of the second chamber 404b.

Apparatus 400 may further be configured such that, subsequent to the pumping having been implemented on the given discrete pad 408 in second chamber 404b, and after the discrete pad 408 has been placed in registration with the fourth chamber 404d, the apparatus exposes the surface of the discrete pad 408 to a purge gas, such as an inert gas, such as nitrogen or argon, that may be used to purge this surface from any residual volatile compounds left over from pumping within the second chamber 404b. Apparatus 400 may further be configured such that, subsequent to the application of the purge gas, and after the discrete pad 408 has been placed in registration with the fifth chamber 404e, the apparatus may effect a pumping of any gases, vapors, or particles, including any residual purge gases, from the surface.

Referring still to FIG. 4, according to this example of the second embodiment, apparatus 400 may further be configured such that, subsequent to the pumping having been implemented on the given discrete pad 408 in second chamber 404b, and after the discrete pad 408 has been placed in registration with the third chamber 404c, the apparatus may apply heat, for example using heating element 414, such as a radiative heating element, to the surface of the discrete pad 408 in registration with chamber 404c, and supply a second reactive gas to the surface. The environment of the third chamber 404c is to form and vaporize a second "etch layer" on the surface of the discrete pad 408, and it may do so through local heating as shown by local heated region 416 of substrate 406, the local heating having been effected by heating element 414. This stage of the smoothing process may for example correspond to a second instance, within the method implemented by apparatus 400, of stages 206 and 212 of the process depicted schematically in FIG. 2.

Apparatus 400 may further be configured such that, subsequent to exposure of the surface of the discrete pad 408 to the second reactive plasma or ionic gas in the third chamber 404c, and after this same discrete pad has been placed in registration with the sixth chamber 404f, the apparatus pumps away gases, vapors and/or any suspended particles by way of the sixth chamber 404f.

Apparatus 400 may further be configured such that, subsequent to the pumping having been implemented on the given discrete pad 408 in sixth chamber 404f, and after the discrete pad 408 has been placed in registration with the seventh chamber 404g, the apparatus exposes the surface of the discrete pad 408 to another purge gas (which may be the same or different from the purge gas applied in fourth chamber 402d), such as an inert gas, that may be used to purge this surface from any residual volatile compounds left over from pumping within the sixth chamber 404f. Apparatus 400 may further be configured such that, subsequent to the application of the purge gas, and after the discrete pad 408 has been placed in registration with the eighth chamber 404h, the apparatus may effect a pumping of any gases, vapors, or particles, including any residual purge gases, from the surface.

According to the second embodiment, as depicted by way of example in the apparatus 400 of FIG. 4, a smoothing cycle of the apparatus may therefore involve exposure of a discrete pad on a substrate to the first chamber 404a (involving the application of the first reactive plasma or ionic gas), followed by the second chamber 404b (involving the application of heat and the pumping of gases, vapors and/or particles), followed by the fourth and fifth chambers 404d and 404e (involving the exposure of the discrete pad to the purge gas and the pumping of residual gases, vapors and particles from the discrete surface after application of the purge gas), followed by the third chamber (involving the application of heat and the application of the second reactive plasma or ionic gas), followed by the sixth chamber 404f (involving pumping of gases, vapor and/or particles), followed by the seventh and eighth chambers 404g and 404h (involving the exposure of the discrete pad to the purge gas and the pumping of residual gases, vapors and particles from the discrete surface after application of the purge gas for the second time).

As an example of a reactive gas according to embodiments, where the discrete pads to be smoothed include copper surfaces, an oxygen gas may be introduced into a pressure controlled system. Formation of an oxygen plasma may, according to one example, take place at a radio frequency (RF) power of approximately 1000 watts and at a pressure of approximately 1.5 Torr. Once the plasma is created, anisotropic formation of copper oxide occurs as the volatile compound/etch layer/reactive layer on the surface of the exposed discrete copper pad as a result of the electric field lines between the plasma and the copper film on the surface of the copper pad, which field lines drive the oxygen ions into the copper perpendicular to the surface of the film.

According to one alternative for embodiments (either the first embodiment or the second embodiment), after conversion of the exposed copper region into the copper oxide compounds, the compounds may be removed from the metal film using a wet clean. The wet clean may involve a wet clean reactant, such as (NH4)Cl. This solvent may be chosen for its ability to remove the copper oxide compounds without any deleterious effect on the copper film itself. An advantage of this alternative over using heating to remove the etch layer on the copper surface is that the etching is anisotropically implemented in a conventional reactive ion etch system without the usual high temperature requirement for vaporizing the etch layer. The wet clean Some examples pairings of a reactant gas and of an associated wet clean reactant according to some embodiments may include the following: (1) the first reactive gas being chlorine ions and the wet clean reactant being selected from the group consisting of HCl, NH$_4$OH, MeOH, ether, alcohol, acetone or water; (2) the first reactive gas comprises oxygen ions and the wet clean reactant is selected from the group consisting of HCl, NH$_4$OH, NH$_4$Cl, KCN, NH$_4$F or acid; (3) the first reactive gas comprises fluorine ions and the wet clean reactant is selected from the group consisting of HCl, HF, H$_2$O or mineral acid; (4) the first reactive gas comprises bromine ions and the wet clean reactant is selected from the group consisting of HCl, NH$_4$OH, HBr, H$_2$O, NH$_3$, acetone, alcohol or pyridine; (5) the first reactive gas comprises iodine ions and the wet clean reactant is selected from the group consisting of HCl, KI, KCN or NH$_3$.

Figure 5:
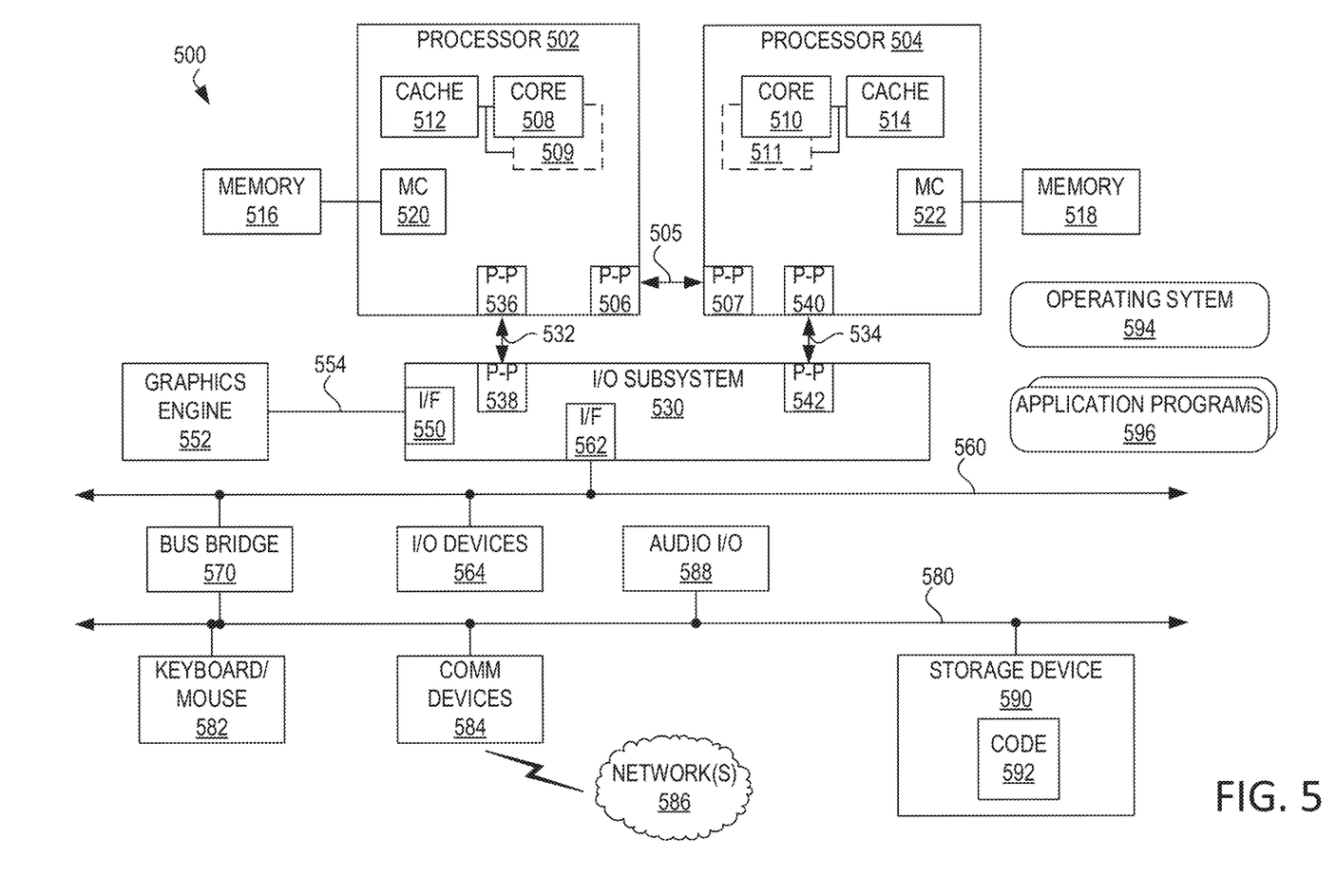
FIG. 5 is a block diagram of an exemplary computing device in which technologies described herein may be implemented.

FIG. 5 is a block diagram of an exemplary computing device in which technologies described herein may be implemented. Generally, components shown in FIG. 5 can communicate with other shown components, although not all connections are shown, for ease of illustration. The device 500 is a multiprocessor system comprising a first processor 502 and a second processor 504 and is illustrated as comprising point-to-point (P-P) interconnects. For example, a point-to-point (P-P) interface 506 of the processor 502 is coupled to a point-to-point interface 507 of the processor 504 via a point-to-point interconnection 505. It is to be understood that any or all of the point-to-point interconnects illustrated in FIG. 5 can be alternatively implemented as a multi-drop bus, and that any or all buses illustrated in FIG. 5 could be replaced by point-to-point interconnects.

As shown in FIG. 5, the processors 502 and 504 are multicore processors. Processor 502 comprises processor cores 508 and 509, and processor 504 comprises processor cores 510 and 511. Processor cores 508-511 can execute computer-executable instructions in a manner similar to that discussed below in connection with FIG. 6, or in other manners.

Processors 502 and 504 further comprise at least one shared cache memory 512 and 514, respectively. The shared caches 512 and 514 can store data (e.g., instructions) utilized by one or more components of the processor, such as the processor cores 508-509 and 510-511. The shared caches 512 and 514 can be part of a memory hierarchy for the device 500. For example, the shared cache 512 can locally store data that is also stored in a memory 516 to allow for faster access to the data by components of the processor 502. In some embodiments, the shared caches 512 and 514 can comprise multiple cache layers, such as level 1 (L1), level 2 (L2), level 3 (L3), level 4 (L4), and/or other caches or cache layers, such as a last level cache (LLC).

Although the device 500 is shown with two processors, the device 500 can comprise any number of processors. Further, a processor can comprise any number of processor cores. A processor can take various forms such as a central processing unit, a controller, a graphics processor, an accelerator (such as a graphics accelerator or digital signal processor (DSP)) or a field programmable gate array (FPGA). A processor in a device can be the same as or different from other processors in the device. In some embodiments, the device 500 can comprise one or more processors that are heterogeneous or asymmetric to a first processor, accelerator, FPGA, or any other processor. There can be a variety of differences between the processing elements in a system in terms of a spectrum of metrics of merit including architectural, microarchitectural, thermal, power consumption characteristics and the like. These differences can effectively manifest themselves as asymmetry and heterogeneity amongst the processors in a system. In some embodiments, the processors 502 and 504 reside in the same die package.

Processors 502 and 504 further comprise memory controller logic (MC) 520 and 522. As shown in FIG. 5, MCs 520 and 522 control memories 516 and 518 coupled to the processors 502 and 504, respectively. The memories 516 and 518 can comprise various types of memories, such as volatile memory (e.g., dynamic random access memories (DRAM), static random access memory (SRAM)) or non-volatile memory (e.g., flash memory). While MCs 520 and 522 are illustrated as being integrated into the processors 502 and 504, in alternative embodiments, the MCs can be logic external to a processor and can comprise one or more layers of a memory hierarchy.

Processors 502 and 504 are coupled to an Input/Output (I/O) subsystem 530 via P-P interconnections 532 and 534. The point-to-point interconnection 532 connects a point-to-point interface 536 of the processor 502 with a point-to-point interface 538 of the I/O subsystem 530, and the point-to-point interconnection 534 connects a point-to-point interface 540 of the processor 504 with a point-to-point interface 542 of the I/O subsystem 530. Input/Output subsystem 530 further includes an interface 550 to couple I/O subsystem 530 to a graphics engine 552, which can be a high-performance graphics engine. The I/O subsystem 530 and the graphics engine 552 are coupled via a bus 554. Alternately, the bus 554 could be a point-to-point interconnection.

Input/Output subsystem 530 is further coupled to a first bus 560 via an interface 562. The first bus 560 can be a Peripheral Component Interconnect (PCI) bus, a PCI Express bus, another third generation I/O interconnection bus or any other type of bus.

Various I/O devices 564 can be coupled to the first bus 560. A bus bridge 570 can couple the first bus 560 to a second bus 580. In some embodiments, the second bus 580 can be a low pin count (LPC) bus. Various devices can be coupled to the second bus 580 including, for example, a keyboard/mouse 582, audio I/O devices 588 and a storage device 590, such as a hard disk drive, solid-state drive, or other storage devices for storing computer-executable instructions (code) 592. The code 592 can comprise computer-executable instructions for performing technologies described herein. Additional components that can be coupled to the second bus 580 include communication device(s) 584, which can provide for communication between the device 500 and one or more wired or wireless networks 586 (e.g. Wi-Fi, cellular or satellite networks) via one or more wired or wireless communication links (e.g., wire, cable, Ethernet connection, radio-frequency (RF) channel, infrared channel, Wi-Fi channel) using one or more communication standards (e.g., IEEE 802.11 standard and its supplements).

The device 500 can comprise removable memory such as flash memory cards (e.g., SD (Secure Digital) cards), memory sticks, Subscriber Identity Module (SIM) cards). The memory in device 500 (including caches 512 and 514, memories 516 and 518 and storage device 590) can store data and/or computer-executable instructions for executing an operating system 594 and application programs 596. Example data includes web pages, text messages, images, sound files, video data, biometric thresholds for particular users or other data sets to be sent to and/or received from one or more network servers or other devices by the device 500 via one or more wired or wireless networks, or for use by the device 500. The device 500 can also have access to external memory (not shown) such as external hard drives or cloud-based storage.

The operating system 594 can control the allocation and usage of the components illustrated in FIG. 5 and support one or more application programs 596. The application programs 596 can include common mobile computing device applications (e.g., email applications, calendars, contact managers, web browsers, messaging applications) as well as other computing applications and utilities, such as a virtual keyboard.

The device 500 can support various input devices, such as a touchscreen, microphones, camera, physical keyboard, virtual keyboard, proximity sensor and trackball, and one or more output devices, such as a speaker and a display, such as a micro-LED display including a backpanel where the contact pads have been smoothed using an apparatus and method according to embodiments. Other possible input and output devices include piezoelectric and other haptic I/O devices. Any of the input or output devices can be internal to, external to or removably attachable with the device 500. External input and output devices can communicate with the device 500 via wired or wireless connections.

In addition, the computing device 500 can provide one or more natural user interfaces (NUIs). For example, the operating system 594 or applications 596 can comprise speech recognition logic as part of a voice user interface that allows a user to operate the device 500 via voice commands Further, the device 500 can comprise input devices and logic that allows a user to interact with the device 500 via a body, hand, or face gestures. For example, a user's hand gestures can be detected and interpreted to provide input to a gaming application.

The device 500 can further comprise one or more communication components 584. The components 584 can comprise wireless communication components coupled to one or more antennas to support communication between the system 500 and external devices. The wireless communication components can support various wireless communication protocols and technologies such as Near Field Communication (NFC), Wi-Fi, Bluetooth, 4G Long Term Evolution (LTE), Code Division Multiplexing Access (CDMA), Universal Mobile Telecommunication System (UMTS) and Global System for Mobile Telecommunication (GSM). In addition, the wireless modems can support communication with one or more cellular networks for data and voice communications within a single cellular network, between cellular networks, or between the mobile computing device and a public switched telephone network (PSTN).

The device 500 can further include at least one input/output port (which can be, for example, a USB, IEEE 1394 (FireWire), Ethernet and/or RS-232 port) comprising physical connectors; a power supply; a satellite navigation system receiver, such as a GPS receiver; a gyroscope; an accelerometer; a proximity sensor; and a compass. A GPS receiver can be coupled to a GPS antenna. The device 500 can further include one or more additional antennas coupled to one or more additional receivers, transmitters and/or transceivers to enable additional functions.

It is to be understood that FIG. 5 illustrates only one exemplary computing device architecture. Computing devices based on alternative architectures can be used to implement technologies described herein. For example, instead of the processors 502 and 504, and the graphics engine 552 being located on discrete integrated circuits, a computing device can comprise an SoC (system-on-a-chip) integrated circuit incorporating multiple processors, a graphics engine, and additional components. Further, a computing device can connect elements via bus or point-to-point configurations different from that shown in FIG. 5. Moreover, the illustrated components in FIG. 5 are not required or all-inclusive, as shown components can be removed and other components added in alternative embodiments.

Figure 6:
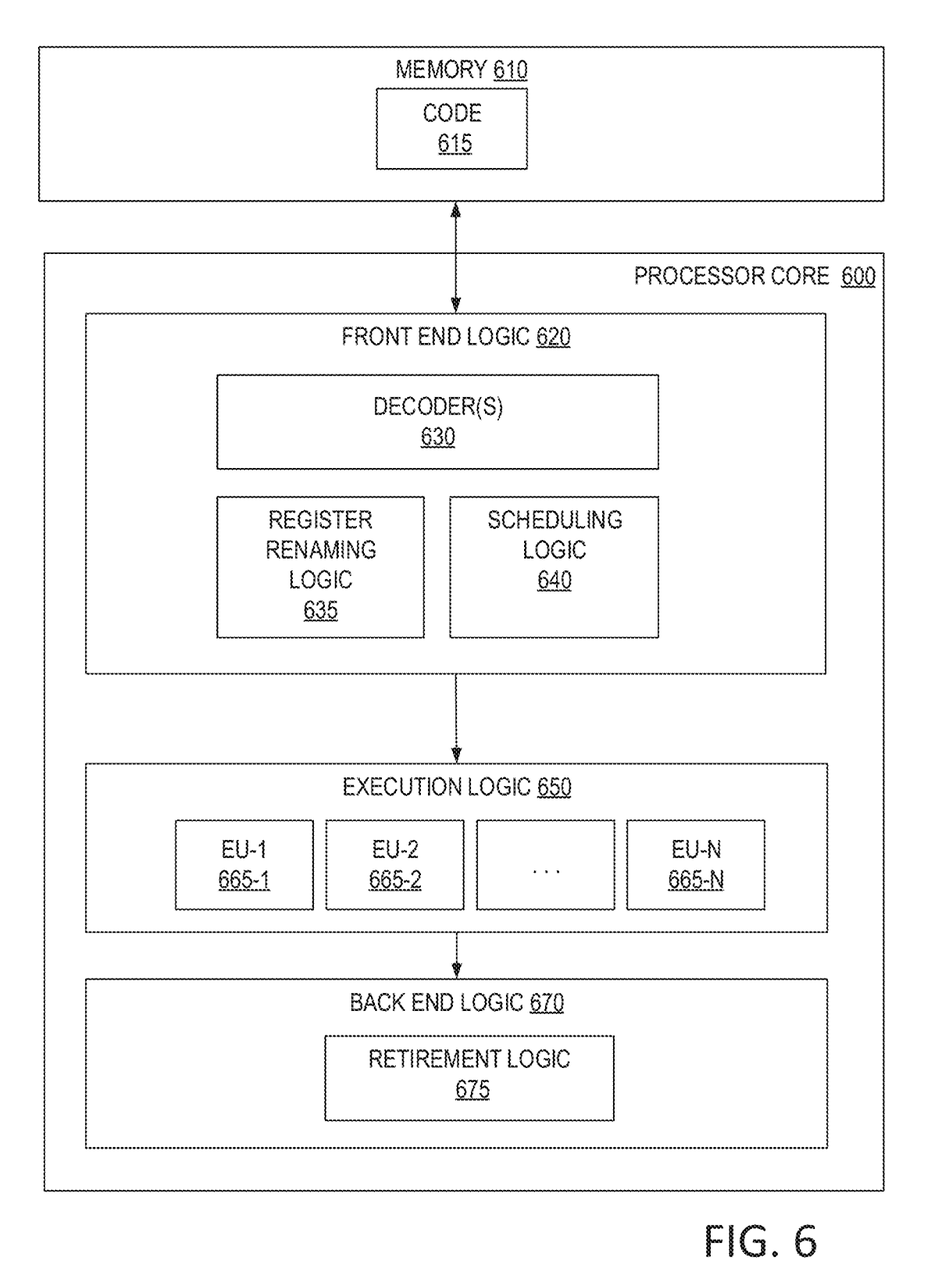
FIG. 6 is a block diagram of an exemplary processor core to execute computer-executable instructions as part of implementing technologies described herein.

FIG. 6 is a block diagram of an exemplary processor core 600 to execute computer-executable instructions as part of implementing technologies described herein. The processor core 600 can be a core for any type of processor, such as a microprocessor, an embedded processor, a digital signal processor (DSP) or a network processor. The processor core 600 can be a single-threaded core or a multithreaded core in that it may include more than one hardware thread context (or "logical processor") per core.

FIG. 6 also illustrates a memory 610 coupled to the processor 600. The memory 610 can be any memory described herein or any other memory known to those of skill in the art. The memory 610 can store computer-executable instruction 615 (code) executable by the processor core 600.

The processor core comprises front-end logic 620 that receives instructions from the memory 610. An instruction can be processed by one or more decoders 630. The decoder 630 can generate as its output a micro operation such as a fixed width micro operation in a predefined format, or generate other instructions, microinstructions, or control signals, which reflect the original code instruction. The front-end logic 620 further comprises register renaming logic 635 and scheduling logic 640, which generally allocate resources and queues operations corresponding to converting an instruction for execution.

The processor core 600 further comprises execution logic 650, which comprises one or more execution units (EUs) 665-1 through 665-N. Some processor core embodiments can include a number of execution units dedicated to specific functions or sets of functions. Other embodiments can include only one execution unit or one execution unit that can perform a particular function. The execution logic 650 performs the operations specified by code instructions. After completion of execution of the operations specified by the code instructions, back-end logic 670 retires instructions using retirement logic 675. In some embodiments, the processor core 600 allows out of order execution but requires in-order retirement of instructions. Retirement logic 670 can take a variety of forms as known to those of skill in the art (e.g., re-order buffers or the like).

The processor core 600 is transformed during execution of instructions, at least in terms of the output generated by the decoder 630, hardware registers and tables utilized by the register renaming logic 635, and any registers (not shown) modified by the execution logic 650. Although not illustrated in FIG. 6, a processor can include other elements on an integrated chip with the processor core 600. For example, a processor may include additional elements such as memory control logic, one or more graphics engines, I/O control logic and/or one or more caches.

Figure 7:
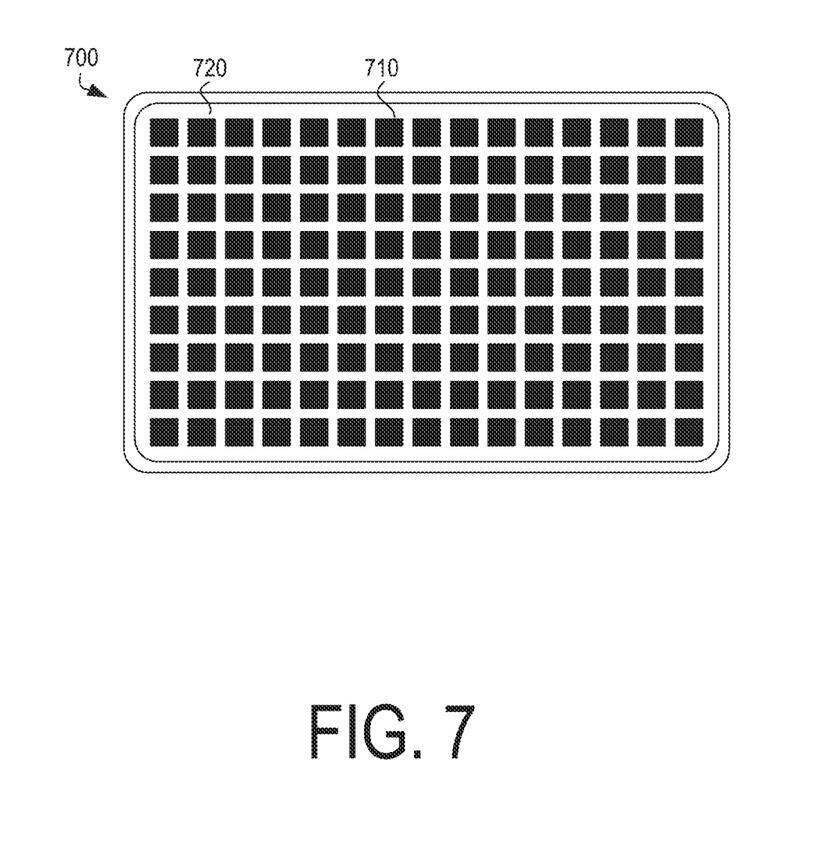
FIG. 7 is an exemplary arrangement of micro-LED elements according to some embodiments.

FIG. 7 illustrates exemplary arrangements of micro-LED elements according to some embodiments and arranged in a display 700, which may correspond to the display architecture of FIG. 1. On display 700, an array of micro-LED elements 710 of the embodiments above, are distributed across a display area 720 which corresponds to a backplane of the display, where the contact pads of either the micro-LED elements and/or the contact pads of the display backplane were smoothed according to embodiments as described herein prior to bonding. The display may be a glass display, such as, by way of example a touchscreen display, or a non-touchscreen display.

Figure 8:
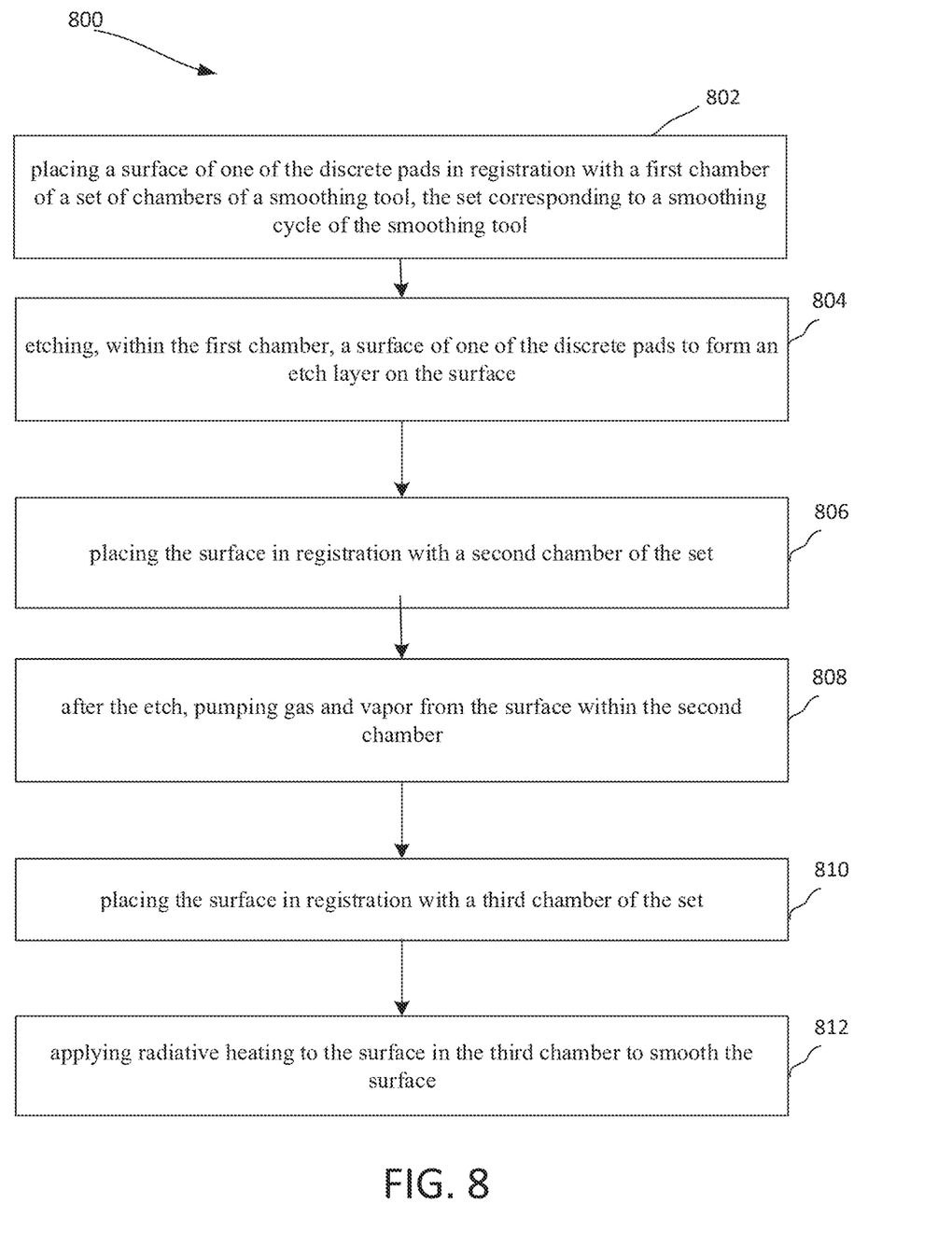
FIG. 8 is a diagram of a process or method according to some embodiments.

FIG. 8 shows a semiconductor manufacturing method 800 to smooth surfaces of discrete pads on a substrate according to some embodiments. At operation 802, process 800 includes placing a surface of one of the discrete pads in registration with a first chamber of a set of chambers of a smoothing tool, the set corresponding to a smoothing cycle of the smoothing tool. At operation 804, process 800 includes etching, within the first chamber, a surface of one of the discrete pads to form an etch layer on the surface. At operation 806, the process includes placing the surface in registration with a second chamber of the set. At operation 808, the process includes after the etch, pumping gas and vapor from the surface within the second chamber. At operation 810, the process includes placing the surface in registration with a third chamber of the set. At operation 812, the process includes applying radiative heating to the surface in the third chamber to smooth the surface.

Software may be embodied as a software package, code, instructions, instruction sets and/or data recorded on non-transitory computer readable storage mediums. Firmware may be embodied as code, instructions or instruction sets and/or data that are hard-coded (e.g., nonvolatile) in memory devices. As used in any embodiment herein, the term "circuitry" can comprise, for example, singly or in any combination, hardwired circuitry, programmable circuitry such as computer processors comprising one or more individual instruction processing cores, state machine circuitry, and/or firmware that stores instructions executed by programmable circuitry. Modules described herein may, collectively or individually, be embodied as circuitry that forms a part of one or more devices. Thus, any of the modules can be implemented as circuitry, such as continuous itemset generation circuitry, entropy-based discretization circuitry, etc. A computer device referred to as being programmed to perform a method can be programmed to perform the method via software, hardware, firmware, or combinations thereof.

Any of the disclosed methods can be implemented as computer-executable instructions or a computer program product. Such instructions can cause a computer or one or more processors capable of executing computer-executable instructions to perform any of the disclosed methods. Generally, as used herein, the term "computer" refers to any computing device or system described or mentioned herein, or any other computing device. Thus, the term "computer-executable instruction" refers to instructions that can be executed by any computing device described or mentioned herein, or any other computing device.

The computer-executable instructions or computer program products, as well as any data created and used during implementation of the disclosed technologies, can be stored on one or more tangible or non-transitory computer-readable storage media, such as optical media discs (e.g., DVDs, CDs), volatile memory components (e.g., DRAM, SRAM), or non-volatile memory components (e.g., flash memory, solid state drives, chalcogenide-based phase-change non-volatile memories). Computer-readable storage media can be contained in computer-readable storage devices such as solid-state drives, USB flash drives, and memory modules. Alternatively, the computer-executable instructions may be performed by specific hardware components that contain hardwired logic for performing all or a portion of disclosed methods, or by any combination of computer-readable storage media and hardware components.

The computer-executable instructions can be part of, for example, a dedicated software application or a software application that is accessed via a web browser or other software application (such as a remote computing application). Such software can be read and executed by, for example, a single computing device or in a network environment using one or more networked computers. Further, it is to be understood that the disclosed technology is not limited to any specific computer language or program. For instance, the disclosed technologies can be implemented by software written in C++, Java, Perl, JavaScript, Adobe Flash, or any other suitable programming language. Likewise, the disclosed technologies are not limited to any particular computer or type of hardware.

Furthermore, any of the software-based embodiments (comprising, for example, computer-executable instructions for causing a computer to perform any of the disclosed methods) can be uploaded, downloaded, or remotely accessed in a variety of manners. For example, such instructions can be uploaded, downloaded, or remotely accessed using the Internet, the World Wide Web, an intranet, cable (including fiber optic cable), magnetic communications, electromagnetic communications (including RF, microwave, and infrared communications), and electronic communications.

As used in this application and in the claims, a list of items joined by the term "and/or" can mean any combination of the listed items. For example, the phrase "A, B and/or C" can mean A; B; C; A and B; A and C; B and C; or A, B and C. As used in this application and in the claims, a list of items joined by the term "at least one of" can mean any combination of the listed terms. For example, the phrase "at least one of A, B or C" can mean A; B; C; A and B; A and C; B and C; or A, B, and C.

The disclosed methods, apparatuses and systems are not to be construed as limiting in any way. Instead, the present disclosure is directed toward all novel and nonobvious features and aspects of the various disclosed embodiments, alone and in various combinations and subcombinations with one another. The disclosed methods, apparatuses, and systems are not limited to any specific aspect or feature or combination thereof, nor do the disclosed embodiments require that any one or more specific advantages be present or problems be solved.

Theories of operation, scientific principles or other theoretical descriptions presented herein in reference to the apparatuses or methods of this disclosure have been provided for the purposes of better understanding and are not intended to be limiting in scope. The apparatuses and methods in the appended claims are not limited to those apparatuses and methods that function in the manner described by such theories of operation.

Although the operations of some of the disclosed methods are described in a particular, sequential order for convenient presentation, it is to be understood that this manner of description encompasses rearrangement, unless a particular ordering is required by specific language set forth herein. For example, operations described sequentially may in some cases be rearranged or performed concurrently. Moreover, for the sake of simplicity, the attached figures may not show the various ways in which the disclosed methods can be used in conjunction with other methods.

The following examples pertain to additional embodiments of technologies disclosed herein.

Example 1 includes a semiconductor manufacturing apparatus to smooth surfaces of discrete pads on a substrate, the apparatus including: a gas plate including a housing defining therein a set of discrete open chambers associated with a smoothing cycle, the chambers having respective openings adapted to be placed in registration with corresponding ones of the surfaces to expose the corresponding ones of the surfaces to respective processes of the chambers to smooth the corresponding ones of the surfaces; and a heating element coupled to the housing to supply heat to at least one of the chambers; wherein the chambers include a first chamber to receive a reactive gas therein to etch a surface of one of the discrete pads when the surface in registration therewith to form an etch layer on the surface, a second chamber to provide a pumping environment to pump gas and vapor from the surface after the etch in the first chamber and when the surface is in registration therewith, and a third chamber to provide a heating environment to heat the surface when the surface is in registration therewith.

Example 2 includes the subject matter of Example 1, and optionally, wherein the second chamber and the third chamber correspond to a single chamber to both provide a heating environment to heat the surface to vaporize the etch layer, and to provide a pumping environment to pump residual reactive gas and vaporized etch layer material from the single chamber after the etch in the first chamber and when the surface is in registration with the single chamber.

Example 3 includes the subject matter of Example 1, and optionally, wherein the pumping environment is a first pumping environment, and wherein the chambers further include a fourth chamber to receive a purge gas therein to purge the surface of residual reactive gas and vaporized etch layer material after pumping in the second chamber when the surface is in registration with the fourth chamber, and a fifth chamber to provide a second pumping environment to pump residual purge gas from the fifth chamber after purging in the fourth chamber and when the surface is in registration with the fifth chamber.

Example 4 includes the subject matter of Example 3, and optionally, wherein the purge gas includes an inert gas.

Example 5 includes the subject matter of Examples 1 and 3-4, and optionally, wherein the reactive gas is a first reactive gas and the etch is a first etch, and wherein the third chamber is further adapted to receive a second reactive gas therein to effect a second etch of the surface while applying heat to the surface after pumping in the second chamber and when the surface is in registration with the third chamber.

Example 6 includes the subject matter of Example 3, and optionally, wherein the apparatus is configured such that the fourth chamber and the fifth chamber are disposed between the second chamber and the third chamber.

Example 7 includes the subject matter of Example 5, and optionally, wherein the apparatus is further adapted to receive a wet clean reactant within the housing to effect a wet clean of the surface after the etch in the first chamber using a wet clean reactant.

Example 8 includes the subject matter of Example 7, and optionally, wherein: the first reactive gas comprises chlorine ions and the wet clean reactant is selected from the group consisting of HCl, $NH_4OH$, MeOH, ether, alcohol, acetone or water; the first reactive gas comprises oxygen ions and the wet clean reactant is selected from the group consisting of HCl, $NH_4OH$, $NH_4Cl$, KCN, $NH_4F$ and acid; the first reactive gas comprises fluorine ions and the wet clean reactant is selected from the group consisting of HCl, HF, $H_2O$ or mineral acid; the first reactive gas comprises bromine ions and the wet clean reactant is selected from the group consisting of HCl, $NH_4OH$, HBr, $H_2O$, $NH_3$, acetone, alcohol or pyridine; or the first reactive gas comprises iodine ions and the wet clean reactant is selected from the group consisting of HCl, KI, KCN or $NH_3$.

Example 9 includes the subject matter of Examples 1-8, and optionally wherein the gas plate is adapted to move with respect to the substrate to move the surface into successive registration with successive ones of the chambers of the set to take the surface through the smoothing cycle.

Example 10 includes the subject matter of Examples 1-9, and optionally wherein the housing defines a plurality of sets of chambers identical to the set and corresponding to repetitions of the smoothing cycle, the apparatus adapted to at least one of successively expose the surface to a plurality of the sets to smooth the surface or expose at least some of the surfaces simultaneously to processes of corresponding ones of the chambers of the plurality of sets.

Example 11 includes the subject matter of Examples 1-9, and optionally wherein the discrete pads are micro-light emitting diode (micro-LED) contact pads, and wherein the substrate is a display backplane of a display on which the micro-LED contact pads are disposed.

Example 12 includes a semiconductor manufacturing method to smooth surfaces of discrete pads on a substrate, the method including: placing a surface of one of the discrete pads in registration with a first chamber of a set of chambers of a smoothing tool, the set corresponding to a smoothing cycle of the smoothing tool; etching, within the first chamber, a surface of one of the discrete pads to form an etch layer on the surface; placing the surface in registration with a second chamber of the set; after the etch, pumping gas and vapor from the surface within the second chamber; placing the surface in registration with a third chamber of the set; and applying radiative heating to the surface in the third chamber to smooth the surface.

Example 13 includes the subject matter of Example 12, and optionally, wherein the second chamber and the third chamber correspond to a single chamber, and wherein pumping and applying radiative heating occur in the single chamber to both heat the surface to vaporize the etch layer and pump residual reactive gas and vaporized etch layer material from the single chamber.

Example 14 includes the subject matter of Example 12, and optionally, further including receiving a purge gas in a fourth chamber of the smoothing tool to purge the surface of residual reactive gas and vaporized etch layer material after pumping in the second chamber, and pumping residual purge gas from a fifth chamber after purging in the fourth chamber.

Example 15 includes the subject matter of Example 14, and optionally, wherein the purge gas includes an inert gas.

Example 16 includes the subject matter of Examples 10 and 14-15, and optionally wherein the reactive gas is a first reactive gas and the etch is a first etch, and wherein the method further includes receiving a second reactive gas in the third chamber to effect a second etch of the surface while applying heat to the surface after pumping in the second chamber.

Example 17 includes the subject matter of Example 16, and optionally, wherein the method includes receiving the purge gas in the fourth chamber and pumping the residual purge gas in the fifth chamber after pumping gas in the second chamber and before receiving the second reactive gas and applying heat in the third chamber.

Example 18 includes the subject matter of Example 16, and optionally, wherein the method further includes wet cleaning the surface after the etch in the first chamber using a wet clean reactant.

Example 19 includes the subject matter of Example 18, and optionally, wherein: the first reactive gas comprises chlorine ions and the wet clean reactant is selected from the group consisting of HCl, $NH_4OH$, MeOH, ether, alcohol, acetone or water; the first reactive gas comprises oxygen ions and the wet clean reactant is selected from the group consisting of HCl, $NH_4OH$, $NH_4Cl$, KCN, $NH_4F$ or acid; the first reactive gas comprises fluorine ions and the wet clean reactant is selected from the group consisting of HCl, HF, $H_2O$ or mineral acid; the first reactive gas comprises bromine ions and the wet clean reactant is selected from the group consisting of HCl, $NH_4OH$, HBr, $H_2O$, $NH_3$, acetone, alcohol or pyridine; or the first reactive gas comprises iodine ions and the wet clean reactant is selected from the group consisting of HCl, KI, KCN or $NH_3$.

Example 20 includes the subject matter of Examples 12-19, and optionally, wherein the method includes moving the smoothing apparatus with respect to the substrate to move the surface into successive registration with successive ones of the first chamber, the second chamber and the third chamber of the set to take the surface through the smoothing cycle.

Example 21 includes the subject matter of Examples 12-20, and optionally, wherein the smoothing tool defines a plurality of sets of chambers identical to the set and corresponding to repetitions of the smoothing cycle, the method including at least one of successively exposing the surface to a plurality of the sets to smooth the surface or exposing at least some of the surfaces simultaneously to processes of corresponding ones of the chambers of the plurality of sets.

Example 22 includes the subject matter of Examples 10-17, and optionally, wherein the discrete pads are micro-light emitting diode (micro-LED) contact pads, and wherein the substrate is a display backplane of a display on which the micro-LED contact pads are disposed.

Example 23 includes semiconductor manufacturing apparatus to smooth surfaces of discrete pads on a substrate, the apparatus including: means for placing a surface of one of the discrete pads in registration with a first chamber of a set of chambers of a smoothing tool, the set corresponding to a smoothing cycle of the smoothing tool; means for etching, within the first chamber, a surface of one of the discrete pads to form an etch layer on the surface; means for placing the surface in registration with a second chamber of the set; means for, after the etch, pumping gas and vapor from the surface within the second chamber; means for placing the surface in registration with a third chamber of the set; and means for applying radiative heating to the surface in the third chamber to smooth the surface.

Example 24 includes the subject matter of Example 23, and optionally, wherein the second chamber and the third chamber correspond to a single chamber, and wherein the means for pumping and the means for applying radiative heating include the single chamber to both heat the surface to vaporize the etch layer and pump residual reactive gas and vaporized etch layer material from the single chamber.

Example 25 includes the subject matter of Example 23, and optionally, further including means for receiving a purge gas in a fourth chamber of the smoothing tool to purge the surface of residual reactive gas and vaporized etch layer material after pumping in the second chamber, and means for pumping residual purge gas from a fifth chamber after purging in the fourth chamber.

What we claim is:

1. A semiconductor manufacturing method to smooth surfaces of discrete electroconductive pads on a substrate, the method including:
    placing a surface of one of the discrete electroconductive pads in registration with a first chamber of a set of chambers of a smoothing tool, the set corresponding to a smoothing cycle of the smoothing tool;
    effecting an etch, using a reactive gas and within the first chamber, of a surface of one of the discrete electroconductive pads to form an etch layer on the surface;
    placing the surface in registration with a second chamber of the set;
    after the etch, pumping gas away from the surface and the second chamber;
    placing the surface in registration with a third chamber of the set; and
    vaporizing the etch layer by applying radiative heating to the surface in the third chamber to smooth the surface thereby generating vaporized etch layer material, vaporizing including reducing a root mean square roughness of the surface as compared with a root mean square roughness thereof in the first chamber.

2. The method of claim 1, wherein the second chamber and the third chamber correspond to a single chamber, and wherein pumping and applying radiative heating occur in the single chamber, pumping further including pumping the vaporized etch layer material from the single chamber.

3. The method of claim 1, further including receiving a purge gas in a fourth chamber of the smoothing tool to purge the surface of residual reactive gas and vaporized etch layer material after pumping in the second chamber, and pumping residual purge gas from a fifth chamber after purging in the fourth chamber, wherein the purge gas includes an inert gas.

4. The method of claim 3, wherein the reactive gas is a first reactive gas and the etch is a first etch, and wherein the method further includes receiving a second reactive gas in the third chamber to effect a second etch of the surface while applying heat to the surface after pumping in the second chamber.

5. The method of claim 4, wherein the method includes receiving the purge gas in the fourth chamber and pumping the residual purge gas in the fifth chamber after pumping gas in the second chamber and before receiving the second reactive gas and applying heat in the third chamber.

6. The method of claim 4, wherein the method further includes wet cleaning the surface after the etch in the first chamber using a wet clean reactant.

7. The method of claim 6, wherein:
    the first reactive gas comprises chlorine ions and the wet clean reactant is selected from the group consisting of HCl, $NH_4OH$, MeOH, ether, alcohol, acetone, or water;
    the first reactive gas comprises oxygen ions and the wet clean reactant is selected from the group consisting of HCl, $NH_4OH$, $NH_4Cl$, KCN, $NH_4F$ or acid;
    the first reactive gas comprises fluorine ions and the wet clean reactant is selected from the group consisting of HCl, HF, $H_2O$ or mineral acid;
    the first reactive gas comprises bromine ions and the wet clean reactant is selected from the group consisting of HCl, $NH_4OH$, HBr, $H_2O$, $NH_3$, acetone, alcohol, or pyridine; or
    the first reactive gas comprises iodine ions and the wet clean reactant is selected from the group consisting of HCl, KI, KCN or $NH_3$.

8. The method of claim 1, wherein the method includes moving the surface into successive registration with successive ones of the first chamber, the second chamber and the third chamber of the set to take the surface through the smoothing cycle.

9. The method of claim 1, wherein the smoothing tool defines a plurality of sets of chambers identical to the set and corresponding to repetitions of the smoothing cycle, the method including at least one of successively exposing the surface to a plurality of the sets to smooth the surface or exposing at least some of the surfaces simultaneously to processes of corresponding ones of the chambers of the plurality of sets.

10. The method of claim 1, wherein the discrete electroconductive pads are micro-light emitting diode (micro-LED) contact pads, and wherein the substrate is a display backplane of a display on which the micro-LED contact pads are disposed.

* * * * *